United States Patent
Morrison et al.

(10) Patent No.: US 10,797,699 B1
(45) Date of Patent: Oct. 6, 2020

(54) SYSTEM AND METHOD FOR CALIBRATING AN ELECTRO-PERMANENT MAGNET KEY SWITCH ASSEMBLY

(71) Applicant: Dell Products, LP, Round Rock, TX (US)

(72) Inventors: Jason S. Morrison, Chadron, NE (US); Mark A. Casparian, Miami, FL (US)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 16/405,941

(22) Filed: May 7, 2019

(51) Int. Cl.
  *H03K 17/972* (2006.01)
  *H01H 36/00* (2006.01)
  *H01F 7/06* (2006.01)
  *H01F 7/02* (2006.01)
  *G06F 3/01* (2006.01)

(52) U.S. Cl.
  CPC ......... *H03K 17/972* (2013.01); *H01F 7/0273* (2013.01); *H01F 7/064* (2013.01); *H01H 36/004* (2013.01); *G06F 3/016* (2013.01)

(58) Field of Classification Search
  CPC ......... H01H 2221/04; H01H 2227/036; H01H 13/7065; H01H 2227/034; H01H 36/004; H01H 3/125; H03K 17/972; H03K 2217/96023; H03K 2217/96042; H03K 2217/96062; H01F 7/0226; H01F 7/0273; H01F 7/122; H01F 7/14; H01F 7/18; H01F 7/204; G06F 3/0219; G06F 3/0238
  See application file for complete search history.

(56) References Cited

U.S. PATENT DOCUMENTS

| | | | |
|---|---|---|---|
| 2006/0132446 A1* | 6/2006 | Soh | G06F 3/0202 345/168 |
| 2015/0341030 A1* | 11/2015 | De Saulles | G06F 3/0221 341/32 |
| 2016/0030835 A1* | 2/2016 | Argiro | G06F 3/017 463/33 |
| 2017/0186412 A1* | 6/2017 | Vazquez Diaz | G10F 1/02 |

* cited by examiner

*Primary Examiner* — Omeed Alizada
(74) *Attorney, Agent, or Firm* — Prol Intellectual Property Law, PLLC; H. Kenneth Prol

(57) ABSTRACT

An electro-permanent magnet (EPM) key assembly of an information handling system may include an electro-permanent magnet (EPM) that may include a low-coercivity magnet and a high-coercivity magnet and a magnetic field sensor to detect the magnitude of the magnetic field of the EPM; and a calibration module to calibrate the magnitude of the magnetic field of the EPM by receiving a sensed magnitude value of the magnetic field of the EPM and adjusting the magnitude value of the magnetic field of the EPM when that magnitude value deviates from an established value by a threshold amount.

20 Claims, 5 Drawing Sheets

SYSTEM AND METHOD FOR CALIBRATING AN ELECTRO-PERMANENT MAGNET KEY SWITCH ASSEMBLY

FIELD OF THE DISCLOSURE

The present disclosure generally relates to a key switch assembly of, for example, an information handling system. The present disclosure more specifically relates to the use of electropermanent magnets in a key switch assembly of a keyboard.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Further, the information handling system may include a keyboard for manual input of information by the user.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
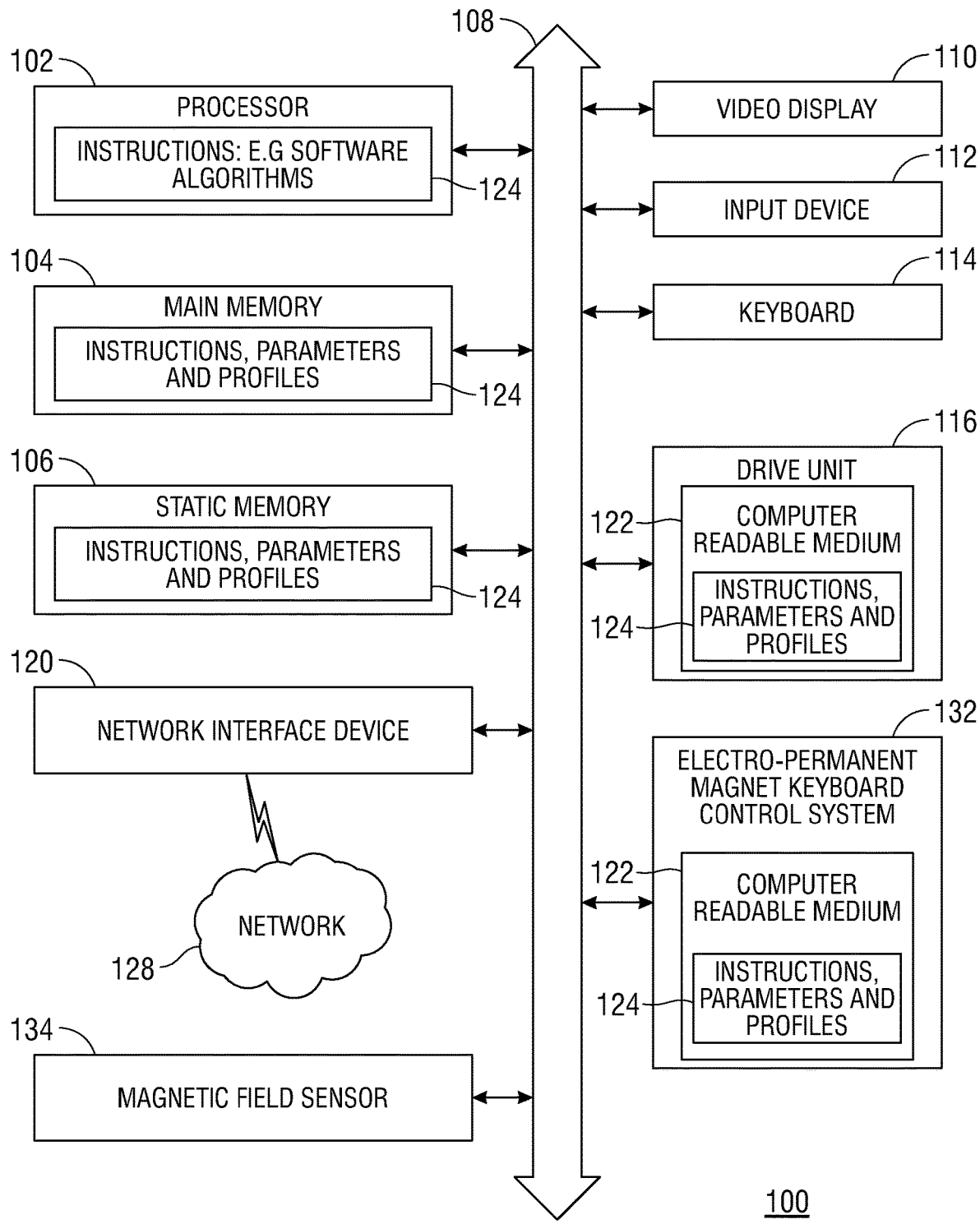
FIG. 1 is a block diagram illustrating an information handling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Embodiments of the present disclosure provide for a key assembly that may include a key cap situated atop two scissor plates that may rotate outward from one another as a user applies downward force to the key cap (e.g., pressing the key). In embodiments of the present disclosure, the outward rotation of the scissor plates caused by the user applying downward force on the key cap may simultaneously cause a flange susceptible to magnetic forces to rotate away from a magnet situated beneath the scissor plates. Once the user removes the downward force in such an embodiment, the magnet may exert a magnetic force to pull the flange operably connected to the scissor plates back toward the magnet. This may cause the scissor plates to rotate toward one another, pushing the key cap back to its neutral position, flush with the surface of the keyboard.

In addition to providing sufficient upward force to return the key back to its neutral position, use of such a magnetic key assembly in an embodiment may supply a consistent upward force the user must overcome in order to depress the key cap far enough for the information handling system to register its depression as a keystroke. This resistive key force, referred herein also as actuation force, may feel to the user as if the key cap is travelling a deeper distance into the keyboard than it actually is. This may, accordingly, reduce the actual thickness of the keyboard while still maintaining a tactile sensation to a user that the keyboard is robust than it is. Additionally, the used of the magnetic key assembly in the keyboard may reduce the materials used to form the keyboard thereby reducing costs and weight of the keyboard.

Permanent magnets may be employed in magnetic keyboard assemblies in order to generate the upward force necessary to return the key cap to a neutral position and provide the user with the desired tactile sensation while depressing the key cap. However, magnetic fields generated by such permanent magnets cannot be adjusted, but rather, provide the same attractive force consistently. As such, the use of permanent magnets may not allow for an adjustment.

Embodiments of the present disclosure employ EPMs in the key assembly in order to provide an adjustable upward force to return each key cap to its neutral position, and to allow each key to be placed in a plurality of neutral positions such as a raised neutral or a retracted, depressed position. In the present description and in the appended claims, the term "neutral" is meant to be understood as a position of the EPM key assembly that is raised. In an example, a neutral EPM key assembly is in a position to receive actuation force from a user so as to receive input from a user at the EPM key assembly. In the present description and in the appended claims, the term "retracted" is meant to be understood as a position of the EPM that is lowered. In an example, the retracted EPM key assembly is in a position such that it appears to or cannot receive input from a user via any actuation by the user.

Embodiments of the present disclosure describes each EPM key assembly that may include a separate electropermanent magnet, which may be controlled on an individual basis by an electropermanent magnet keyboard control system. Such embodiments allow the user to set an entire keyboard or even a single key within the keyboard to be retracted and deactivated via turning the EPM for that key or keys to an off state. In other embodiments, an entire keyboard or specific keys may also be set to a specific resistive force chosen by the user to provide the optimal tactile sensation for that user if a multi-level EPM is used in the key assembly. The low intensity magnetic field generated by such an electropermanent magnet in embodiments of the present disclosure may thus allow for more granular control of each key.

In order to ensure that the EPMs associated with each of the EPM key assemblies produce the optimal tactile sensation for that user, a magnetic field sensor such as a hall-effect sensor may be used. In this embodiment, the magnetic field sensor may detect the magnitude of the magnetic field produced by each of the EPMs. The values of the detected magnetic field may be sent to and received by a processor of the information handling system. The information handling system and, in a specific embodiment, a calibration module may determine when any of a plurality of EPMs of the plurality of EPM key assemblies varies from an established value. This established value may be application-specific (based on the application being executed by the information handling system), user-specific (based on user actuation input), and/or comparatively specific (based on a comparison of the magnitude of the magnetic field of other EPMs). After the established value has been compared to the magnitude value of the measured magnetic field of any given EPM, the information handling system may adjust the magnitude value of the magnetic field associated with those EPMs that have a magnitude value that varies from the established value. An established value may be a magnitude value set by a manufacturer or may, in an embodiment, set by characteristics of the EPMs. The variance in the magnitude value to the established value may exceed a threshold value sufficient to adjust the magnitude of the magnetic field of any given EPM. The adjustment of the magnetic field of any given EPM may be accomplished by application of a current pulse to that given EPM and, more specifically, an electrically conductive wire coiled around a low-coercivity magnet within the EPM as described herein. The level of current provided as well as the voltage (positive or negative electric potential across the electrically conductive wire) may be varied in order to achieve the established magnetic field magnitude value described herein. This allows for the magnetic field magnitude to be adjusted despite any degradation of any of the electrical and/or mechanical elements of the EPM key assemblies over time or through use of the information handling system. Additionally, this also allows for the magnetic field magnitude to be adjusted despite manufacturing defects that may be present among each of the EPMs.

In order to ensure such a low intensity magnetic field is also sufficient to return the key cap to its neutral position, embodiments of the present disclosure may also add flange protrusions to the flanges operably connected to the scissor plates that are to be drawn toward the magnet to place the key cap back in its neutral position. These flange protrusions may wrap around the external sides of the electropermanent magnet in embodiments, in order to increase the cross-sectional surface area in which the flanges operably connected to the scissor plates overlaps the magnetic field of the electropermanent magnet. As the overlapping surface area increases, so too does the force with which the electropermanent magnet draws the flanges operably connected to the scissor plates toward it. Using such an electropermanent magnet key assembly may provide an upward force to return each key cap to its neutral position when the EPM is in an on state.

The proximity between the interior surfaces of the flange protrusions and the exterior sides of magnetically soft shunts formed at the electro-permanent magnet may be set to increase the ability of the magnetic field generated by the electro-permanent magnet and propagated by the magnetically soft shunts in embodiments to draw the flange protrusions toward the magnetically soft shunts and electro-permanent magnet. As such, a method or mechanism capable of maintaining the critical proximity between the interior surfaces of the flange protrusions and the exterior sides of the magnetically soft shunts may be used.

Actuation of the EPM within the EPM key assembly may be accomplished through charging a low-coercivity magnet among one or more of the high-coercivity magnets by passing a current through an electrically conductive wire wrapped around the low-coercivity magnet in order to align the polarities of the low- and high coercivity magnets. A single current pulse applied to the electrically conductive wire may not fully saturate the low-coercivity magnet so as to sufficiently provide a key force resistance to a user actuating the EPM key assembly. However, a single low current pulse may still cause a retracted key assembly to raise up to a raised neutral position. The one or more current pulses may be adjusted to modify the EPM saturation level of magnetic force.

In order to increase the key force resistance sufficiently to allow a user to have the impression of actuating the EPM key assembly, the present disclosure may describe a process or method of controlling an EPM of an EPM key assembly. This process or method may include the application of a first current pulse to the electrically conductive wire followed by a time delay and a second current pulse to the electrically conductive wire. The calibration of magnitude of one or more current pulses or the delay may be used to adjust the EPM saturation level of magnetic force upon turning the EPM to an on state.

The systems and methods described herein allows for the electro-permanent magnet (EPM) key assembly to selectively be placed in a retracted position and a normal position using the EPM. Additionally, when not being in use or not to be in use, the keys of the EPM key assembly may be retracted to prevent any actuation of the key by the user or to prevent damage of the keys when not in use. Still further, the actuation force by a user used to actuation the EPM key assembly may set to be similar to all other EPM key assemblies despite any mechanical degradation of the various parts with the EPM key assemblies by calibration of EPM saturation levels across any number of EPM key assemblies.

In some embodiments of the present disclosure, the length of time of the delay between the application of the first and second current pulse may be dependent on the voltage applied to the electrically conductive wire, the distance of the flange to the EPM, the weight of the flange/key, or combinations thereof. With these parameters in mind, the force used to actuate the EPM key assembly by a user may be adjusted based on the user's selected parameters, parameters of an application executed by a processing device of the information handling system, or combinations thereof. In some embodiments of the present disclosure, the magnetic field sensor may continuously sense a magnitude of a magnetic field produced by the individual EPMs during this application of the first and second current pulse. Thus, the user may cause the force used to actuate the EPM key assembly to be adjusted before and during interacting with the information handling system for calibration purposes. For example, EPM key assemblies may have force adjustments to establish consistent key assembly actuation force levels across all or a plurality of key assemblies on a keyboard.

FIG. 1 illustrates an information handling system 100 similar to information handling systems according to several aspects of the present disclosure. In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 can be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver, a wireless telephone, a land-line telephone, a control system, a camera, a scanner, a facsimile machine, a printer, a pager, a personal trusted device, a web appliance, or any other suitable machine capable of executing a set of instructions (sequential or otherwise) that specify actions to be taken by that machine, and can vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the information handling system 100 can be implemented using electronic devices that provide voice, video or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system 100 can include one or more storage devices, one or more communications ports for communicating with external devices, as well as, various input and output (I/O) devices, such as a keyboard, a mouse, a video/graphic display, or any combination thereof. The information handling system 100 can also include one or more buses operable to transmit communications between the various hardware components. Portions of an information handling system 100 may themselves be considered information handling systems 100.

Information handling system 100 can include devices or modules that embody one or more of the devices or execute instructions for the one or more systems and modules described herein, and operates to perform one or more of the methods described herein. The information handling system 100 may execute code instructions 124 that may operate on servers or systems, remote data centers, or on-box in individual client information handling systems according to various embodiments herein. In some embodiments, it is understood any or all portions of code instructions 124 may operate on a plurality of information handling systems 100.

The information handling system 100 may include a processor 102 such as a central processing unit (CPU), control logic or some combination of the same. Any of the processing resources may operate to execute code that is either firmware or software code. Moreover, the information handling system 100 can include memory such as main memory 104, static memory 106, computer readable medium 122 storing instructions 124 of the electropermanent magnet keyboard control system 132, and drive unit 116 (volatile (e.g. random-access memory, etc.), nonvolatile (read-only memory, flash memory etc.) or any combination thereof). The information handling system 100 can also include one or more buses 108 operable to transmit communications between the various hardware components such as any combination of various input and output (I/O) devices.

The information handling system 100 may further include a video display 110. The video display 110 in an embodiment may function as a liquid crystal display (LCD), an organic light emitting diode (OLED), a flat panel display, a solid-state display, or a cathode ray tube (CRT). Additionally, the information handling system 100 may include an input device 112, such as a cursor control device (e.g., mouse, touchpad, or gesture or touch screen input, and a keyboard 114. The information handling system 100 can also include a disk drive unit 116.

The network interface device shown as wireless adapter 120 can provide connectivity to a network 128, e.g., a wide area network (WAN), a local area network (LAN), wireless local area network (WLAN), a wireless personal area network (WPAN), a wireless wide area network (WWAN), or other network. Connectivity may be via wired or wireless connection. The wireless adapter 120 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. In some aspects of the present disclosure, one wireless adapter 120 may operate two or more wireless links.

Wireless adapter 120 may connect to any combination of macro-cellular wireless connections including 2G, 2.5G, 3G, 4G, 5G or the like from one or more service providers. Utilization of radiofrequency communication bands according to several example embodiments of the present disclosure may include bands used with the WLAN standards and WWAN carriers, which may operate in both license and unlicensed spectrums. For example, both WLAN and WWAN may use the Unlicensed National Information Infrastructure (U-NII) band which typically operates in the ~5 MHz frequency band such as 802.11 a/h/j/n/ac (e.g., center frequencies between 5.170-5.785 GHz). It is understood that any number of available channels may be available under the 5 GHz shared communication frequency band. WLAN, for example, may also operate at a 2.4 GHz band. WWAN may operate in a number of bands, some of which are proprietary but may include a wireless communication frequency band at approximately 2.5 GHz band for example. In additional examples, WWAN carrier licensed bands may operate at frequency bands of approximately 700 MHz, 800 MHz, 1900 MHz, or 1700/2100 MHz for example as well.

In some embodiments, software, firmware, dedicated hardware implementations such as application specific integrated circuits, programmable logic arrays and other hardware devices can be constructed to implement one or more of some systems and methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions, parameters, and profiles 124 or receives and executes instructions, parameters, and profiles 124 responsive to a propagated signal, so that a device connected to a network 128 can communicate voice, video or data over the network 128. Further, the instructions 124 may be transmitted or received over the network 128 via the network interface device or wireless adapter 120.

The information handling system 100 can include a set of instructions 124 that can be executed to cause the computer system to perform any one or more of the methods or computer-based functions disclosed herein. For example, instructions 124 may execute an electropermanent magnet keyboard control system 132, software agents, or other aspects or components. Various software modules comprising application instructions 124 may be coordinated by an operating system (OS), and/or via an application programming interface (API). An example operating system may include Windows®, Android®, and other OS types. Example APIs may include Win 32, Core Java API, or Android APIs.

The disk drive unit 116 and the electropermanent magnet keyboard control system 132 may include a computer-readable medium 122 in which one or more sets of instructions 124 such as software can be embedded. Similarly, main memory 104 and static memory 106 may also contain a computer-readable medium for storage of one or more sets of instructions, parameters, or profiles 124 including an estimated training duration table. The disk drive unit 116 and static memory 106 may also contain space for data storage. Further, the instructions 124 may embody one or more of the methods or logic as described herein. For example, instructions relating to the electropermanent magnet keyboard control system 132 software algorithms, processes, and/or methods may be stored here. In a particular embodiment, the instructions, parameters, and profiles 124 may reside completely, or at least partially, within the main memory 104, the static memory 106, and/or within the disk drive 116 during execution by the processor 102 of information handling system 100. As explained, some or all of the electropermanent magnet keyboard control system 132 may be executed locally or remotely. The main memory 104 and the processor 102 also may include computer-readable media.

Main memory 104 may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The electropermanent magnet keyboard control system 132 may be stored in static memory 106, or the drive unit 116 on a computer-readable medium 122 such as flash memory or magnetic disk in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

The information handling system 100 may also include the electropermanent magnet keyboard control system 132 that may be operably connected to the bus 108. The electropermanent magnet keyboard control system 132 computer readable medium 122 may also contain space for data storage. The electropermanent magnet keyboard control system 132 may, according to the present description, perform tasks related to controlling the magnetic field generated by an electropermanent magnet within a key switch assembly and/or turning EPMs from an on state to an off state or vice-versa among a plurality of keys. In these embodiments, the electropermanent magnet keyboard control system 132 may receive or caused to be received data from a magnetic field sensor 134. As described herein, the data sent to the electropermanent magnet keyboard control system 132 from the magnetic field sensors 134 may be used by the electropermanent magnet keyboard control system 132, the processor 102, calibration module (not shown in FIG. 1), and/or the information handling system 100, generally, to adjust the magnetic field of any given EPM associated with any given EPM key assembly. In some embodiments, any current level applied to any of the plurality of electrically conductive wires coiled around the low-coercivity magnets may correspond to a user-selected magnitude when a stepped electropermanent magnet system is used. In some embodiments, any current level applied to any of the plurality of electrically conductive wires coiled around any of the plurality of low-coercivity magnets may correspond to an application-selected magnitude when a stepped electro-permanent magnet system is used. In an embodiment, the stepped electropermanent magnet may be stepped using varying current pulse levels applied to the electrically conductive wires. In another embodiment, the stepped electropermanent magnet may be stepped using a plurality of EPMs and/or low-coercivity magnets.

In an embodiment, the electropermanent magnet keyboard control system 132 may communicate with the main memory 104, the processor 102, the video display 110, the alpha-numeric input device 112, and the network interface device 120 via bus 108, and several forms of communication may be used, including ACPI, SMBus, a 24 MHZ BFSK-coded transmission channel, or shared memory. Keyboard driver software, firmware, controllers and the like may communicate with applications on the information handling system 100.

In other embodiments, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

When referred to as a "system", a "device," a "module," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCM-CIA) card, or other such expansion card), or a system (such as a motherboard, a system-on-a-chip (SoC), or a stand-alone device). The system, device, controller, or module can include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module can also include a combination of the foregoing examples of hardware or software. In an embodiment an information handling system 100 may include an integrated circuit or a board-level product having portions thereof that can also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another can communicate directly or indirectly through one or more intermediaries.

Figure 2:
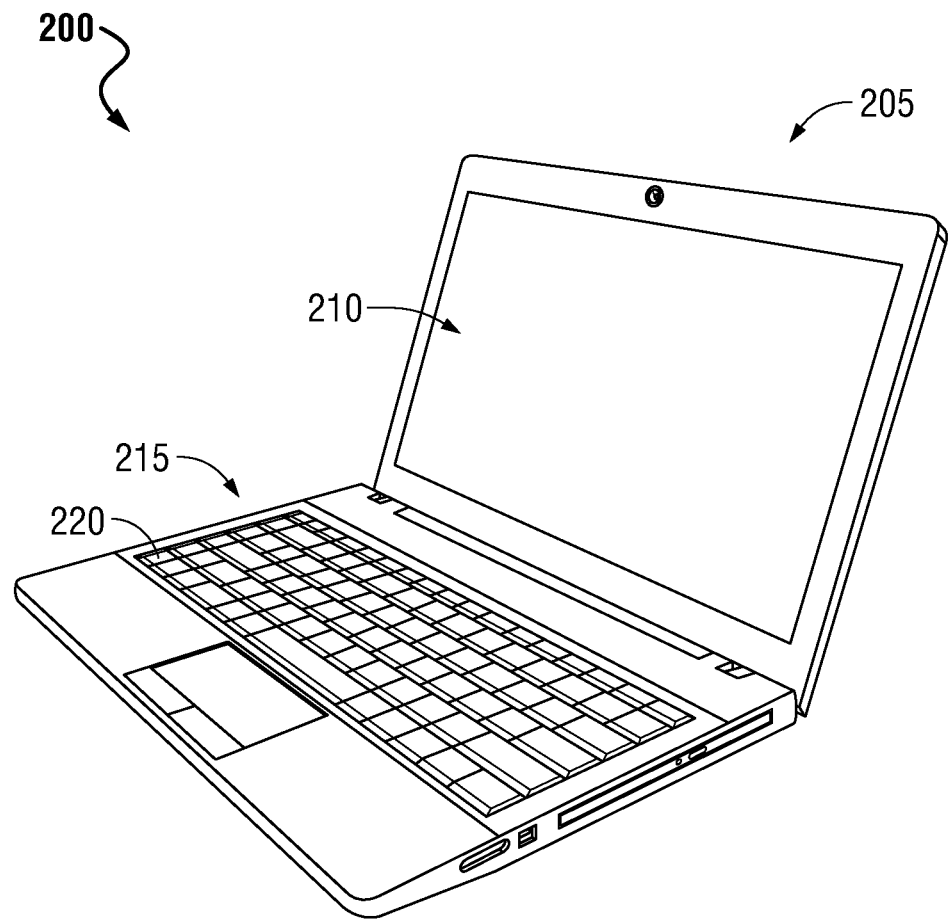
FIG. 2 is a perspective graphical diagram of an information handling system with an electropermanent magnet keyboard control system according to an embodiment of the present disclosure.

FIG. 2 is a perspective graphical diagram of an information handling system 200 with an electropermanent magnet keyboard control system 132 according to an embodiment of the present disclosure. Although FIG. 2 depicts the information handling system 200 as being implemented in a laptop computing device, FIG. 2 is not meant to be limiting and the present specification contemplates that the use of other types of information handling system as described herein. In the example, the information handling system 200 may include a screen portion 210 and a keyboard portion 215. The screen portion 210 may include any device that can present to a user any visual data as output to a user in response to input and execution of the instructions, parameters, and profiles 124 by the processor 102 described in connection with FIG. 1. In an example embodiment, a graphical user interface may be presented to a user to input any number of parameters descriptive of the actuation force used to actuate any number of keys 220 present on the keyboard portion 215 of the information handling system 200.

The keyboard portion 215 may include any number of keys 220 arranged in any manner so as to receive input from a user via selective actuation of those keys 220. In an embodiment, the keys 220 may be arranged similar to a QWERTY-type keyboard layout or any other alphabetic, symbolic, and/or numeric layout. In an embodiment, the keys 220 may be any number of keys from 1 to infinity.

In an embodiment of the present description, each of the keys 220 may be associated with an electro-permanent magnet (EPM). The EPM may be used to selectively attract a flange coupled to a pair of scissor plates and a key cap as described herein. The EPM may selectively attract the flange through application of a current to an electrically conductive wire coiled around a low-coercivity magnet among a number of high-coercivity magnets. Application of this current causes the poles of the low-coercivity magnet to line up with the poles of the high-coercivity magnets. In such an embodiment, the magnetic fields of the high-coercivity magnets and the low-coercivity magnet may compound to generate a magnetic field having an intensity greater than that of either the high-coercivity magnetic field or the low-coercivity magnetic field alone. In an embodiment, the EPM includes a number of magnetically soft shunts that propagate the force the magnetic field generated by the high- and low-coercivity magnets towards the flange described herein. This compounded magnetic field generated by the high- and low-coercivity magnets and the shunts may be arranged so as to selectively attract the flange towards the EPM thereby causing the individual keys 220 to raise. Accordingly, when an opposite voltage is applied to the electrically conductive coil, a current is passed through the electrically conductive coil resulting in the poles of the magnetic field generated by the low-coercivity magnets being placed in a magnetic state opposite the poles of the magnetic field generated by the high-coercivity magnet. This results in the EPM being placed in an off state and thereby rendered incapable of sufficiently attracting the flange thereby resulting in the individual keys 220 being placed in a recessed state. In this state, the keys 220 may be rendered inoperable, that is, incapable of receiving input from a user via adjustment to the actuation of those recessed keys 220.

The information handling system 200 may include an electropermanent magnet keyboard control system 132 as described herein. In an embodiment, the electropermanent magnet keyboard control system 132 may include one or more sets of instructions that, when executed by a processor, causes a current pulse to be applied to an electrically conductive wire coiled around a low-coercivity magnet as described herein. The one or more sets of instructions of the electropermanent magnet keyboard control system 132 may also include one or more sets of instructions that, when executed by a processor, determines when any of the plurality of EPMs has a magnetic magnitude value that varies from an established value. In an example, the processor may receive, from a magnetic field sensor, a sensed magnitude value of a magnetic field associated with any and/or each of the EPMs within any given EPM or array of EPMs. The one or more sets of instructions of the electropermanent magnet keyboard control system 132 may also include one or more sets of instructions that, when executed by a processor, adjusts the magnitude value of the magnetic field associated with the EPMs having a magnitude value that varies from the established value. This adjustment may be completed via application of a current pulse to an electrically conductive wire coiled around the low-coercivity magnet within each of the EPMs.

In a specific embodiment of the present disclosure, the processor may determine which of the EPMs associated with any of the key assemblies has a lower magnetic field value than the other EPMs. In this example, a maximum magnetic field may have been created at any other EPM, but certain EPMs may have a varying and lower magnetic field value. This difference in magnetic field results in a user-discernable difference in the actuation force for those key assemblies whose EPMs produce the lower magnetic field value. In order to prevent this variance in actuation force, the processor may cause the magnetic field created by each EPM to be set to the comparatively lower magnetic field to set a similar actuation force across multiple key assemblies. Specifically, this may be done by altering how current is applied to any of the electrically conductive coils coiled around any of the EPMs. These alterations may include how often current is applied to the coils, the amperage of any given current pulse applied, a time delay placed between any initial and subsequent current pulse, among other considerations.

In an example, the processor 102 of the information handling system 200 may include a look-up table. In this example, the processor 102 and/or calibration module 136 of the information handling system 200 may access the look-up table in order to determine how a current pulse is to be applied to any given EPM based on the data received by the magnetic field sensor 134. As described herein, the calibration module 136 accesses the look-up table and, based on the data received from the magnetic field sensors 134, causes a current pulse to be applied to the electrically conductive wire coiled around the low-coercivity magnet adjusted for number of pulses, pulse amperage, current pulse delay or other aspects.

The one or more sets of instructions of the electropermanent magnet keyboard control system 132 may also include one or more sets of instructions that, when executed by a processor, causes any number of subsequent current pulses to be applied to the electrically conductive wire from the application of the initial current pulse. In an embodiment, the low-coercivity magnet may be initially set to a first magnetic field magnitude via application of an initial current pulse applied to the electrically conductive wire. This first magnetic field magnitude may initially raise the key cap and flange of the EPM key assembly up but may also have a weak or unusable actuation force if and when a user attempts to actuate the key. By execution of the electropermanent magnet keyboard control system 132, however, application of a subsequent current pulse may place the low-coercivity magnet in a second and relatively higher magnetic field magnitude. In the embodiments presented herein, the initial and/or subsequent current pulses may be applied in order to adjust the individual EPMs to exhibit a magnetic field value that is, within a threshold range, substantially equal to an established value.

In an embodiment, the actuation force of the key after the initial current pulse may be between 10 and 20 grams. That is, after application of the initial pulse, the key of the EPM key assembly may be actuated when between 10 and 20 grams of actuation force is applied to the key. In an embodiment, after application of the initial pulse, the key of the EPM key assembly may be actuated when 15 grams of actuation force is applied to the key.

In an embodiment, the actuation force of the key after any subsequent current pulse may be between 50 and 70 grams. That is, after application of the subsequent pulse, the key of the EPM key assembly may be actuated when between 50 and 70 grams of actuation force is applied to the key so as to overcome the attractive force between the EPM and a ferromagnetic flange. In an embodiment, after application of the subsequent pulse, the key of the EPM key assembly may be actuated when 60 grams of actuation force is applied to the key.

The electropermanent magnet keyboard control system 132 may also include one or more sets of instructions that, when executed by the processor, causes time to pass between the application of any initial current pulse and any subsequent current pulse. This delay period after the application of the initial current pulse may be dependent on a number of factors including the voltage of the initial current pulse, the distance of the flange relative to the EPM, the physical weight of the key and flange, among other factors. In an embodiment, the delay period may be between 0.5 milliseconds and 2.5 milliseconds. In an embodiment, the delay period may be between 1 millisecond and 2 milliseconds. In these embodiments, a user may therefore see the keys initially rise from an inoperable state via application of the initial current pulse thereby indicating that the user may begin to actuate the keys. However, in an embodiment, after a delay of between 0.5 and 2.5 milliseconds, the keys may have a resistive force sufficient for a user to feel as if the key is sufficiently resistive to actuate.

In an embodiment, a single current pulse may be applied to any of the given electrically conductive wires in order to achieve a magnetic field value commensurate with the established value. Again, the look-up table may be accessed by the calibration module 136 in order to adjust the magnitude value of the magnetic field associated with the EPMs when those EPMs have a magnitude value that varies from the established value or to set a new established value lower than a maximum saturation value so as to equalize the EPM levels. The single current pulse may be provided by a power source that can place the EPMs in a state such that their maximum magnetic field is created. In an embodiment, because some of the EPMs may achieve a maximum magnetic field that is lower than other EPMs among a plurality of EPMs, each of the EPMs may be set to a magnetic field that is about equal to that lower magnetic field of the other EPMs. That lower magnetic field may be a newly established value for the EPMs upon which a threshold actuation level may be set. It is understood that an established value of magnetic field may actually be a range of magnetic field values in some embodiments. For example, a range of magnetic field magnitudes around a particular established value may be used as an established value baseline such that a user may not notice or perceive a difference in key actuation force among key assemblies. Some threshold variation beyond that range may determine that adjustment to the magnetic field generated is necessary.

In an embodiment, the application of any current pulse to any of the EPM key assemblies may be dependent on an application being executed on the laptop computing device 205. By way of example, a user may be engaged in providing input, via the keys 220 of the keyboard portion 215, to a processor of the laptop computing device 205 in order to cause output to be provided. In a specific example, this may be in the form of an interaction with a game being executed on the laptop computing device 205. During engagement with the game play, certain keys may be disabled based on certain scenarios or occurrences during game-play. Upon these scenarios or occurrences, the processor may receive instructions to disable the keys by providing a current to any given EPM associated with any given EPM key assembly in order to retract that key. In this case, a reverse voltage current pulse is sent to the EPM in order to disable the magnetic field created by the low-coercivity magnet of the EPM thereby causing the key to fall down. Similarly, in this embodiment, upon certain other scenarios or occurrences, the key may once again be enabled when the processor receives a signal to once again enable that key. This is done by repeating, for this specific key or any given key that has been disabled, the process of applying one or more current pulses to the EPM. The reasons as to if and when any key is enabled, disabled, and/or re-enabled may be dependent on the input provided to the laptop computing device 205 upon execution of the application (such as the gaming application in this embodiment) as well as the output provided by that execution of the application.

In the embodiments presented herein, the information handling system 200 may include a calibration module 136. In an example, the calibration module 136 may form part of the electropermanent magnet keyboard control system 136. The calibration module 136, in an example, may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). In an example, the calibration module 136 may be in the form of software maintained on a computer readable media and executable by the processor of the information handling system 200. In an example, the calibration module 136 may be a combination of both firmware, hardware, and/or software.

In the embodiments presented herein, the calibration module 136 may calibrate the magnitude of the magnetic field of the EPM by receiving a sensed magnitude value of a magnetic field of an EPM and adjusting the magnitude value of the magnetic field of the EPM. The calibration module 136 may receive the sensed magnitude of the magnetic field of the EPM with each of the EPM key assemblies by receiving input from a processor associated with a magnetic field sensor. In this example, the magnetic field sensor may be placed by each of the EPMs in order to detect, in real-time, the magnetic field of the EPM. The magnetic field sensor may send, to the processor of the information handling system 200 signals indicating the magnitude value of the magnetic field produced by any EPM. Accordingly, the processor may then send this information to the calibration module 136 so as to determine how and to what extent each or any of the magnetic fields of the EPMs is to be adjusted. Adjustment of the magnetic fields may be accomplished by causing the processor to signal that one or more current pulses is to be sent to any EPM. The current pulses may vary in frequency and amperes based on the level of adjustments to be made to the magnetic fields of the EPMs.

In an example embodiment, the calibration module 136 may receive data descriptive of the magnitude value of the magnetic field of each of the EPMs among a plurality of EPMs. In this example, the calibration module 136 may adjust the magnetic field of each EPM to a magnitude value about equal to the lowest sensed magnitude value associated with any given EPM. Here, the calibration module may cause the processor to send an appropriate current pulse or pulses to the individual EPMs so as to cause each of the EPMs to emit a magnetic field commensurate with the lowest sensed magnitude value. In an embodiment, an initial calibration process may occur to detect the possible magnetic field value emitted by each EPM so as to determine the lowest magnitude value of the magnetic fields of the EPMs. This information may be maintained on computer-readable memory for access by the calibration module 136. Additionally, these maximum magnitude values of the magnetic fields associated with each EPM may be periodically updated by initiating another calibration process to determine the magnetic field output of each EMP. As described herein, upon manufacture, magnetic or mechanical parts may vary in function or may degrade over time and through use. Due to this variation, the magnitude values may be updated to reflect the physical changes in the information handling system 200 throughout its usable lifetime. For example, the calibration process may also compensate for any variances in manufacturing of the EPMs and/or EPM key assemblies by initially recording the magnitude value of each magnetic field of the EPMs at an initial boot-up of the operating system of the information handling system 200.

By calibrating the EPMs using the calibration module 136 as described herein, the user may not detect a difference in actuation force among a plurality of EPM key assemblies on, for example, a keyboard. As such, the tactile nature of actuating any given key on the keyboard will feel common among all keys thereby increasing user satisfaction and usability of the information handling system 200.

Figure 3:
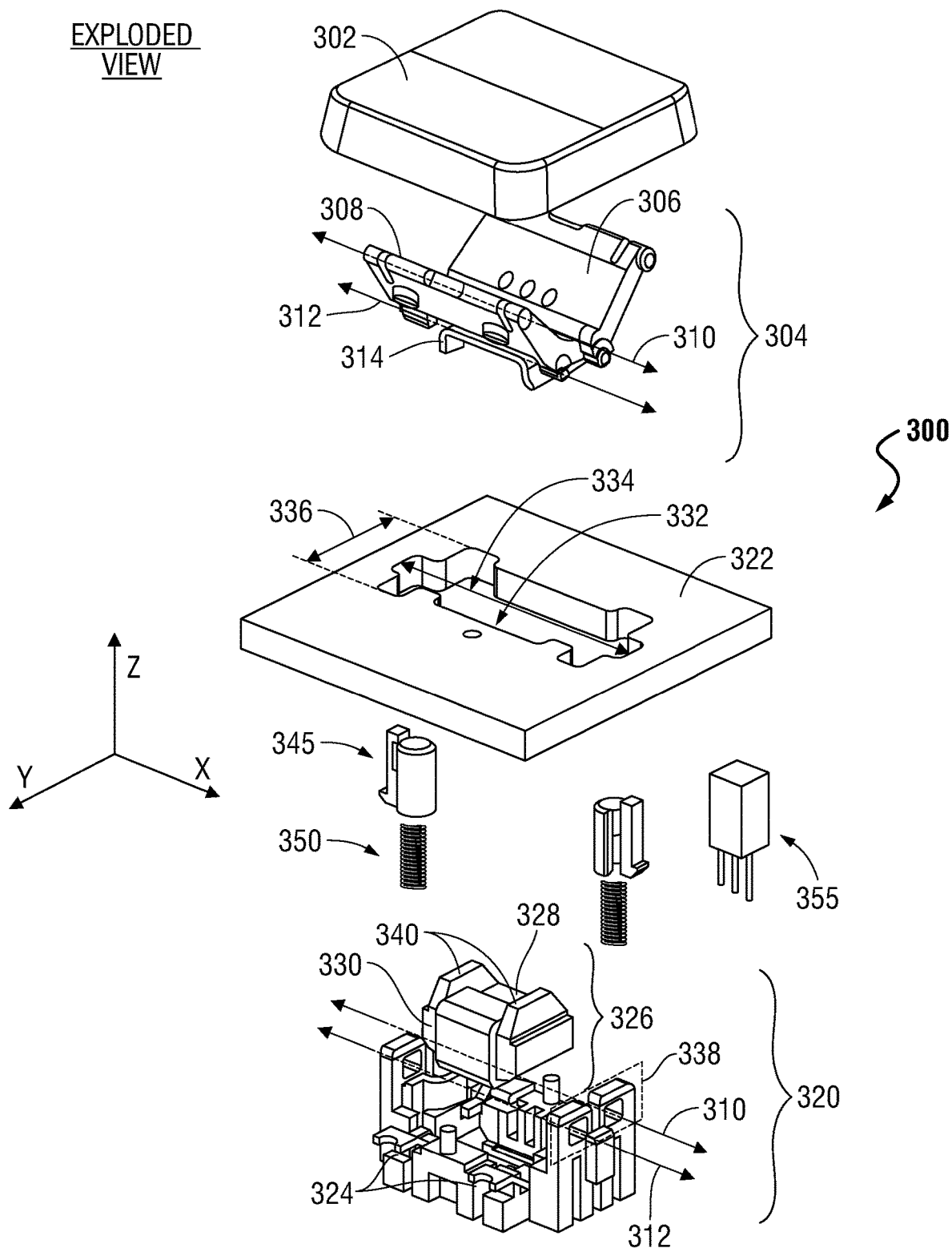
FIG. 3 is an exploded, perspective graphical diagram view of an electro-permanent magnet (EPM) key assembly according to an embodiment of the present disclosure.

FIG. 3 is an exploded, perspective graphical diagram view of an EPM key assembly 300 according to an embodiment of the present disclosure. In an embodiment, the EPM key assembly 300 may include an EPM 326 and a scissor plate flange 314 for magnetic attraction between the flange 314 and the EPM 326. The scissor plate flange 314 may include flange angular protrusions that wrap around outer surfaces of one or more magnetically soft shunts 340 of the EPM 326 as an embodiment. As described herein, the force the magnetic field generated by the EPM 326 and propagated by the magnetically soft shunts 340 exerts on the flange 314 may decrease as the distance between the flange 314 and the magnetically soft shunts 340 increases. An EPM key assembly 300 in an embodiment may enable an information handling system 200 to register a keystroke entered by a user via a keyboard 215. Each key 220 within such a keyboard 215 may include one or more EPM key assemblies 300, and may comprise a key cap 302 lying atop a scissor plate assembly 304 in an embodiment.

The scissor plate assembly 304 in an embodiment may include a rear scissor plate 306 and a front scissor plate 308, the top portions of which (e.g., portions located furthest from a rotation axis 310 and 312) may rotate away from one another when a sufficient downward force is exerted on the key cap 302. Such a rotation in an embodiment may cause either a portion of the scissor plates 306 and 308 themselves, or a mechanism operably attached to the scissor plates 306 and 308 to come into contact with a sensor to indicate the key has been depressed. In such a way, the rotation of the scissor plates 306 and 308 may be actuated while the information handling system 200 registers occurrence of a keystroke.

The scissor plates 306 and 308 in an embodiment may be operably connected to a base contact assembly 320 and a cap support plate 322 fixed to the keyboard portion 220 of the information handling system 200 during operations of the key assembly 300. In other words, depression of the key cap 302 in an embodiment may not cause any substantial vertical movement of the base contact assembly 320 or of the cap support plate 322 formed during actuation. The cap support plate 322 in an embodiment may have an opening 332 disposed vertically through the cap support plate 322 such that objects may pass vertically through the opening 332. The base contact assembly 320 in an embodiment may include one or more scissor plate mounts 338 composed of vertical structures having eye holes disposed horizontally such that objects may pass horizontally through the eye holes in the scissor plate mounts 338. The scissor plate mounts 338 in such an embodiment may be disposed vertically through the opening 332 of the support plate 322 in an embodiment. The cap support plate opening 322 in an embodiment may have a width 334 and a depth 336 sufficient to allow vertical passage of the scissor mounts 338 upward through the opening 332 of the support plate 322. In such an embodiment, scissor plate mounts 338 integrated with or mounted to base contact assembly 320 including the EPM 326 ensure alignment of the scissor plate assembly 304 with the base contact assembly 320 as mounted in a single-plate cap support plate 322. Cap support plate 322 may be a printed circuit board (PCB) with pressure or switch sensors mounted thereon (not shown) to register keystrokes.

In other embodiments, the cap support plate 322 may be formed to include the scissor mount integrated with cap support plate 322 (not shown). For example, the cap support plate 322 may be formed such that a scissor mount projects vertically upward from the cap support plate 322. In an embodiment such as with which the cap support plate 322 is formed using a three-dimensional printing method or other fabrication method, the cap support plate 322 and scissor mount may be comprised of a single structure of consistent material makeup.

The scissor plates 306 and 308 in an embodiment may then be operably connected to the scissor mount 338 such that the rotation axis for each of the scissor plates 306 and 308 transects a cross-sectional area shared by the scissor plates 306 and 308 and the base contact assembly 320. For example, in an embodiment, a pin or similar mechanism may be disposed at the scissor plates rotation axes 310 and 312 and through the one or more holes within the scissor mount 338 to form one or more hinges. In the example embodiment illustrated by FIG. 3, the rear scissor plate 306 may be joined with the scissor mount 338 in such a way to form a hinge allowing the rear scissor plate 306 and flange 314 to rotate about the rear plate rotation axis 310 that transects a cross-sectional area (e.g., in the YZ plane) shared by both the rear scissor plate 306 and the scissor mount 338. Similarly, the front scissor plate 308 may be joined with the scissor mount 338 to allow the front scissor plate 308 to rotate about the front plate rotation axis 312 transecting a cross-sectional area (e.g., in the YZ plane) shared by both the front scissor plate 306 and the scissor mount 338. In other embodiments, the front scissor plate 308 and rear scissor plate 306 may share a single rotational axis.

As described herein, the rotation of the scissor plates 306 and 308 may occur while the information handling system 200 registers occurrence of a keystroke following depression of the key cap 302 by a user. As a downward force is exerted on the key cap 302, the top portions of the rear scissor plate 306 and front scissor plate 308 may move away from one another in the Y-direction. Embodiments of the present disclosure may use any of several methods to register keystrokes. For example, a keystroke in an embodiment described herein may be registered upon detected contact between one of the scissor plates 306 or 308 and a sensor. Such a sensor may be situated, in one example, on the top surface of the cap support plate 322 or integrated into the cap support plate 322, such that the bottom portion of one or both of the scissor plates 306 or 308 comes into contact with the sensor when the key cap 302 reaches its lowest allowable vertical position. The sensor may be, for example, a pressure sensor sensing the downward pressure from the scissor plate(s) 306 or 308, or in another example, an electrical contact that completes a circuit when it comes into contact with a corresponding electrical contact located on the bottom portion of the one or more scissor plates 306 and 308.

As described herein, embodiments of the present disclosure of the EPM key assembly 300 may include an EPM having an on-state and an off-state, or an adjustable magnetic field housed within the base contact assembly 320. An electro-permanent magnet, such as EPM 326 may include one or more high-coercivity magnets 328 situated nearby one or more low-coercivity magnets 330. The high-coercivity magnets 328 in an embodiment may be comprised of a combination of Neodymium, Iron, or Boron. Other embodiments contemplate the use of any of these materials individually, of other materials, or of other combinations that include these materials or others generally used to create permanent magnets, including ferrous platinum, a combination of dysprosium, niobium, gallium and cobalt, and samarium-cobalt. The low-coercivity magnets 330 in an embodiment may be comprised of a combination of aluminum, nickel, and cobalt. Other embodiments contemplate the use of other materials, or other combinations that include these materials or others, including iron.

An electrically conductive wire (e.g., copper wire) may be coiled around the low-coercivity magnets 330 in an embodiment. The EPM keyboard control system 132 in an embodiment may apply a pulse of current in a first direction through the electrically conductive wires coiled around one or more of the low-coercivity magnets 330, causing the poles of the low-coercivity magnets 330 to line up with the poles of the high-coercivity magnets 328. In such an embodiment, the magnetic fields of the high-coercivity magnets 328 and low-coercivity magnets 330 may compound to generate a magnetic field having an intensity greater than that of either the high-coercivity magnetic field or the low-coercivity magnetic field alone. Such a combined magnetic field may also be propagated by one or more magnetically soft shunts 340 within the base contact assembly 320. In an embodiment, the magnetically soft shunts 340 may be made of steel or iron. The compound magnetic force generated by both the high-coercivity magnets 328 and the low-coercivity magnets 330 in such an embodiment may maintain this magnitude until another current pulse is applied to the electrically conductive wire. Thus, embodiments of the present disclosure capitalize on the advantage of electro-permanent magnets to maintain a magnetic field intensity with only a pulse of current. In contrast, electro-magnets require ongoing application of voltage to one or more magnetic components, thus depleting energy resources relatively more quickly than the EPMs described herein.

In another aspect of an embodiment, the EPM keyboard control system 132 may apply a current in a second direction, opposite the first direction, causing the polarity of the magnetic field generated by the low-coercivity magnet 330 to reverse. In such an embodiment, the poles of the magnetic field generated by the high-coercivity magnets 328 may lie opposite the poles of the magnetic field generated by the low-coercivity magnets 330. The magnetic field of the high-coercivity magnet 328 may thus negate the magnetic field of the low-coercivity magnets 330, disabling the EPM 326 such that the total magnetic force of the EPM 326 is zero or of a very low magnitude.

Embodiments of the present disclosure may employ a single EPM 326, including only one high-coercivity magnet and one low-coercivity magnet. Such a single EPM system 326 may be capable of achieving two separate states. First, the single EPM system may achieve an on state, in which the EPM 326 generates a combined magnetic field from the high-coercivity magnet and the low-coercivity magnet. Second, the single EPM system 326 may achieve an off state, in which the magnetic field generated by the high-coercivity magnet negates the magnetic field generated by the low-coercivity magnet.

In another embodiment, multi-step or multiple EPMs (not shown) may be used with the key assembly of the embodiments of the present disclosure. These multi-step or multiple EPMs may include a plurality of high-coercivity magnets or a plurality of low-coercivity magnets. Each of the low-coercivity magnets in such an embodiment may be capable of receiving a current burst independent of the other. For example, the EPM keyboard control system in such an embodiment may apply a first current to a first low-coercivity magnet, causing the magnetic field of the first low-coercivity magnet to combine with the magnetic field of a first high-coercivity magnet. Concurrently, the EPM keyboard control system in such an embodiment may apply a second current to a second low-coercivity magnet, causing the magnetic field of the second low-coercivity magnet to negate the magnetic field of a second high-coercivity magnet or partially negate the magnetic field of the first high-coercivity magnet. In such a way, the EPM keyboard control system 132 in an embodiment may be capable of placing the multi-step or multiple EPMs in one of three different states. For example, the multi-step or multiple EPMs may be placed in a fully on state in which all aspects of EPMs within the multi-step or multiple EPMs are in their respective on states, a fully off state in which all aspects of EPMs are in their respective off states, and a middle state in which one EPM or parts of an EPM are in its on state and another EPM or part of an EPM is in its off state. Further gradation in overall magnetic field strength for the EPM may be achieved in other embodiments by including more than two EPMs within the key assembly 300, or by applying multiple current pulses of increasing amplitude to a single low-coercivity magnet (to increase its magnetic field strength in a step-wise fashion) as described herein. The EPM keyboard control system 132 in an embodiment may thus adjust the magnitude of the total magnetic field generated by the EPM by controlling the direction of current applied to one or more electrically conductive wires coiled around one or more low-coercivity magnets. Thus, although the present application describes various types of EPM arrangements, the present specification describes the application of a first and second current pulse to an electrically conductive wire coiled around at least one low-coercivity magnet associated with at least one high-coercivity magnet. The application of the dual current pulse with a time delay between those current pulses creates a relatively more fully saturated EPM thereby increasing the actuation force required to actuate any given key. This increases the tactile responsiveness of any given key thereby increasing user satisfaction.

The EPM 326 in an embodiment may cause the key cap 302 to return to its neutral position following depression by forcing the scissor plates 306 and 308 toward one another. In an embodiment, such a force may be generated by magnetically attracting a structure, such as flange 314 operably connected to one or more of the scissor plates, down toward the EPM 326. For example, the EPM 326 in an embodiment may generate a magnetic field that attracts a scissor plate flange 314 susceptible to magnetic forces down toward the EPM 326. The flange 314 in an embodiment may be comprised of a ferromagnetic material, such as steel. In such an embodiment, the scissor plate flange 314 may be operably connected to the rear scissor plate 306, and may extend from the base of the rear scissor plate, across the hinged portion of the rear scissor plate rotation axis 310 in the positive Y direction. When operably connected in such a configuration, any rotation of the scissor plate flange 314 about the rear plate rotation axis 310 may cause a rotation of the rear scissor plate 306 in the same direction about the rear plate rotation axis 310. For example, a rotation of the flange 314 about the rear plate rotation axis 310 that is counter-clockwise in the YZ plane may cause a counter-clockwise rotation of the top of the rear scissor plate 306 about the rear plate rotation axis 310. This counter-clockwise rotation may occur, for example, when the scissor plate flange 314, or a portion thereof is drawn downward toward the EPM 326. Thus, the attraction of the flange 314 toward the EPM 326 may cause the top portion of the rear scissor plate 306 to rotate toward the top portion of the front scissor plate 308, forcing the key cap 302 upward.

In an embodiment in which the scissor mount 338 is incorporated within the base contact assembly 320, the integration opening width 334 and depth 336 may be large enough to allow upward passage of the scissor mount 338 through the integration opening 332. In an embodiment in which the scissor mount 338 is incorporated within the cap support plate 322, the integration opening width 234 may be large enough to allow upward passage of a portion of the magnetically soft shunts 340 and downward passage of the flange 314 through the integration opening 332. In each of these embodiments, the dimensions of the integration opening width 334 may be sufficiently narrow such that downward pressure on the cap support plate 322 does not cause any portion of the cap support plate 322 to move vertically with respect to the base contact assembly 320. For example, a portion of the base contact assembly 320 located directly beneath the scissor mount 338 may provide structural support fixing the vertical position of the cap support plate 322 upon final integration of the EPM key assembly 300.

In an embodiment, an upward force on the key cap 302 caused by the magnetic attraction between the flange 314 and the EPM 326 in an embodiment may also control the force with which a user must press down on the key cap 302 in order for the information handling system to register a keystroke. That upward force may be biased in the opposite direction by bias springs 350. These bias springs 350 may assist in retracting the key cap 302 in some embodiments. Bias springs 350 may be mounted vertically between the scissor plate assembly 304 and the base contact assembly 320. The bias springs 350 may be vertically mounted with plungers 345 to assist in biasing the flange 314 for example. Other spring biasing, such as with a leaf spring and rocker arm as described in other embodiments herein may be utilized as well. The magnetic field may be generated by the EPM 326 in an embodiment throughout the vertical movement of the key cap 302 in an embodiment. Thus, a force great enough to overcome the magnetic attraction between the flange 314 and the EPM 326 must be applied to the key cap 302 in order for the contact element within or operably connected to the scissor plate assembly 304 to come into contact with the contact element or other sensor within either the cap support plate 322 or the base contact assembly 320. As described herein, such a contact may be needed in order to register a keystroke. By controlling the direction of current and magnitude of current delivered to the low-coercivity magnets 330 in such an embodiment, the EPM keyboard control system 132 may also control the degree of force required to register a keystroke.

In some embodiments and for purposes of sensing an actuation of the key cap by a user, a portion of the key cap or scissor plates 306 and 308, or a structure extending from or operably attached to the key cap or scissor plates 306 and 308, may initiate contact with a sensor within the base contact assembly 320. For example, a scissor plate switch contact in an embodiment may be operably connected to a spring-biased rocker arm (not shown) connected to the cap support plate 322 via a hinge about which the rocker arm may rotate. Upon final construction of the whole key switch assembly 300 in an embodiment, the rocker arm may extend outward in the Y-direction, such that the scissor plate switch contact is distended slightly further forward in the Y-direction than (but at the same vertical height as) the base switch contact when the key cap 302 is in its neutral position. The scissor plate switch contact may also act as a biasing spring in an embodiment. While in the neutral position, the magnetic field of the EPM 326 may pull the scissor plate flange 314 downward toward the EPM 326, causing the bottom surface of the flange 314 to come into contact with the top surface of the portion of the rocker arm closest to the flange 314. This contact may cause the rocker arm to rotate about its hinge, such that the scissor plate switch contact is pulled in the Y-direction, away from the base switch contact.

When the key cap 302 is forced down to its depressed position in such an embodiment, the rotation of the upper portions of scissor plates 306 and 308 away from one another (in the Y-direction) may cause the scissor plate flange 314 to rotate upward such that it no longer contacts the rocker arm, allowing the spring-biased rocker arm to relax such that the scissor plate switch contact contacts the base switch contact. This contact may close a circuit, which the information handling system in an embodiment may register as a key stroke.

Because each EPM key assembly 300 may include an individually controllable EPM 326 in an embodiment, the EPM keyboard control system 132 may place an EPM 326 associated with particular keys or with the whole keyboard in an on or an off state. By disabling the EPM 326 completely, the EPM keyboard control system 132 may ensure the key cap 302 does not return to its neutral position, thus disallowing the user to enter a keystroke with that key. This may be useful, for example, when the information handling system 200 is a laptop computing device 205 placed in a closed configuration in which the keyboard portion 220 is placed nearby or in close contact with the display screen of the screen portion 210. In such an embodiment, the EPM keyboard control system 132 may detect that the laptop computing device 205 has been placed in the closed configuration, and disable the EPMs 326 for all of the keys in the keyboard portion 220 to draw the key caps 302 away from the display screen of the screen portion 210 such that they do not cause frictional wear and tear on the display screen. In another aspect and as described herein, this retractability may be useful in a gaming scenario in which the key being actuated represents an action currently unavailable to the user (e.g., firing of an unavailable weapon in a first-person-shooter computer game).

Further, the EPM keyboard control system 132 in an embodiment may turn the EPM 326 associated with one or more keys in an on state or an off state according to external stimuli. For example, the information handling system 200 in an embodiment may detect (e.g., via rotation sensors, hall sensors, proximity sensing elements, gyroscopes, etc.) that the information handling system 200 has been placed in a closed or tablet configuration in which the keyboard portion 220 is not likely to be used. In such an embodiment, the EPM keyboard control system 132 may place all of the EPMs 326 in an off state such that the keys cannot be actuated. In such a way, the user may continue to use the information handling system 200 in tablet mode without the risk of erroneous keystrokes. Similarly, by placing the keys in a locked depressed position when the information handling system is in a closed configuration, the EPM keyboard control system 132 in an embodiment may remove the risk of key caps 302 damaging the digital display through unintentional contact between the two.

As another example, the EPM keyboard control system 132 may set the force needed according to a received user input. This may allow each individual user to set the force required to press keys on the keyboard to a level that is tactilely pleasing to the user. In these ways, the EPM keyboard control system 132 in an embodiment may cause the EPM key assembly 300 to provide an upward force to return each key cap 302 to its neutral position, cause the EPM key assembly 300 to remain in a fixed depressed position that disallows the user to register a keystroke and/or apply a user-specified (or externally triggered) resistive key force that may be adjusted on a key by key basis via either user specified selection on a graphical user interface presented to the user or via executed instructions dictated by the instructions, parameters, and profiles 124 associated with the information handling system 200 and/or applications executed by the processor of the information handling system 200.

In embodiments presented herein, the EPM key assembly 300 includes a magnetic field sensor 355. As described herein in connection with FIG. 2, the magnetic field sensor 355 may sense the magnetic field produced by each of the EPMs within an array of EPMs. The magnetic field sensor 355 may assign a value the to magnitude of the sensed magnetic field and provide that data to a processor of an information handling system such as the one described in connection with FIGS. 1 and 2. In an example, the data received by the processor from the magnetic field sensor 355 may be sent to the calibration module for further processing as described herein.

The magnetic field sensor 355 may be any type of device that may sense the magnetic field of each or a plurality of EPMs within the system described herein. In an embodiment, the magnetic field sensor 355 is a hall effect sensor that provides to the processor an output voltage directly proportional to the magnetic field strength detected. The magnetic field sensor 355 is show in FIG. 3 as a solid-state element arranged next to the EPM. However, the present specification contemplates that the magnetic field sensor 355 alternatively be located on the base contact assembly 320 or cap support plate 322 in various embodiments. In an embodiment, the magnetic field sensor 355 may be integrated into a printed circuit board or other support plate for example. Other examples of magnetic field sensors 355 are contemplated by the present disclosure, however, and specific examples are not meant to limit the description of the magnetic field sensor 355 herein.

In an embodiment, for any given EPM, a single magnetic field sensor 355 may be used to sense the magnetic field produced by that EPM. In an embodiment, a magnetic field sensor 355 may be used to detect the magnetic field produced by a plurality of EPMs. In an embodiment, multiple magnetic field sensors 355 may be used to sense the magnetic field produced by any single EPM. In this example, the multiple magnetic field sensors 355 may confirm a sensed value among each other before sending the sensed magnitude value to the processor and/or calibration module. The proximity of the magnetic field sensor 355 to any given EPM may be adjusted based considerations such as the mechanical characteristics of the EPM key assemblies, the sensitivity of the magnetic field sensor 355, and the magnetic field strength produced by the EPM, among others. Specifically, the magnetic field sensor 355 may be placed anywhere where the magnetic field of the EPM is detectable by the magnetic field sensor 355.

Figure 4:
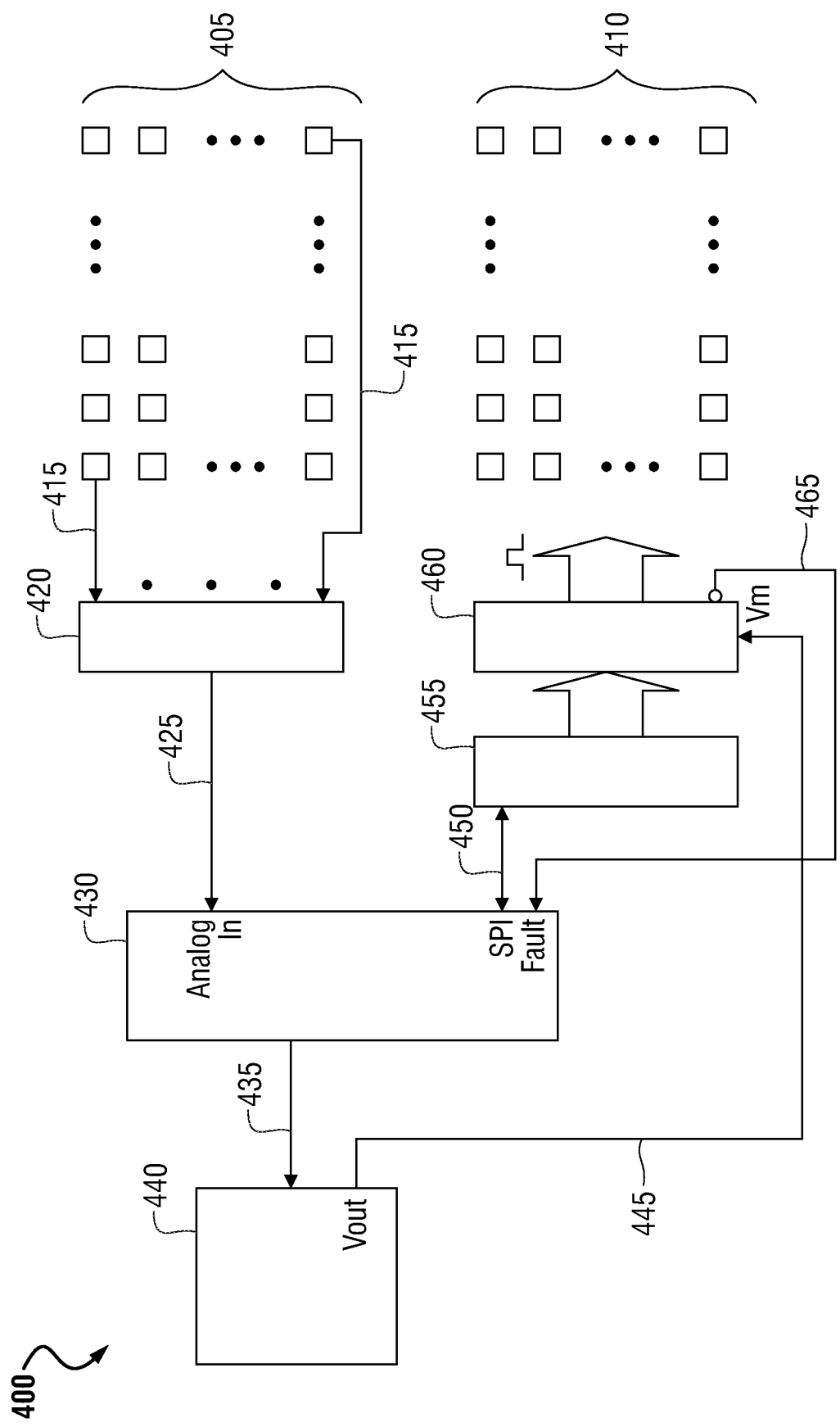
FIG. 4 is a block system diagram of a calibration module of the system of FIG. 1 as it interacts with a flange as the electropermanent magnet keyboard control system is executed according to an embodiment of the present disclosure.

FIG. 4 is a block system diagram of a calibration module 400 of the system of FIG. 1 as it interacts with a flange as the electropermanent magnet keyboard control system is executed according to an embodiment of the present disclosure. The calibration module 400 may interface with an array of magnetic field sensors 405. In an embodiment, a plurality of magnetic field sensors 405 may be arranged, logically and/or physically, to coordinate with an array of EPMs 410. The array of magnetic field sensors 405 may each be electrically coupled to an analog multiplexer 420 via a number of sensor electrical lines 415. The analog multiplexer 420 may receive the input signals from each of the magnetic field sensors within the array of magnetic field sensors 405 and forward those signals onto a micro-control unit (MCU) 430 via signal line 425. As described herein, the signals from the magnetic field sensors 405 to the analog multiplexer 420 and from the analog multiplexer 420 to the MCU 430 indicate a magnitude value of the magnetic field detected by the individual magnetic field sensors. The magnetic field sensors may each be associated with one or more of the EPMs within the array of EPMs 410.

The MCU 430 may serve as the processor used by the calibration module 400 to determine how and when to send current pulses to the EPMs within the array of EPMs 410. In another example, the MCU 430 may be replaced by a processing device associated with the information handling system described in connection with FIGS. 1 and 2. As described herein, the MCU 430 may access data associated with any magnetic field magnitude value detected by the EPMs among the array of EPMs 410. This data may be maintained in a look-up table to be accessed by the MCU 430 during a calibration process executed by the calibration module 400. The data, along with magnitude values of the magnetic fields of the EPMs, may also include key association data. The key association data may define the EPM key assembly specific to those values such that the MCU 430 can coordinate the magnetic field sensors with any given EPM among the arrays 405 and 410.

In an embodiment, the MCU 430 may access a programmable power supply unit 440 via adjustment signal line 435. The programmable power supply unit 440 may be directed by the MCU 430 via a number of adjustment control signals to increase or decrease the voltage output and thus current to any EPM along line 455 in order to achieve an increase or decrease in the measured magnetic field so as to achieve the target adjusted magnetic field value as described herein. During operation, the MCU 430 may also send serial signals via a serial signal line 450 to a serial peripheral interface 455. The signals may be passed to an H-bridge 460 that selectively switches a polarity of the voltage applied to any of the EPMs within the array of EPMs 410. Along with the increase and decrease in voltage provided along line 455 to the H-bridge 460 by the programmable power supply unit 440 as directed by the MCU 430, the programmable power supply unit 440 may alter the current provided to the H-bridge 460. The H-bridge 460 may, per the signals from the serial peripheral interface 455, direct an electrical current to any or all of the EPMs within the array of EPMs 410. Again, the signals may include data descriptive of which of the EPMs are to have any given current pulse applied thereto based on the data received from the array of magnetic field sensors 405.

As described in certain embodiments, the calibration module 400 may include an H-bridge 460. The H-bridge 460 may be any type of electronic circuit that switches a polarity of voltage sent to a load such as each of the EPMs within the EPM array 410. The H-bridge may, therefore, cause the individual EPMs to be saturated or unsaturated as to magnetic field created. In a specific embodiment, the H-bridge 460 may be a half H-bridge. Moreover, H-bridge 460 may have a fault feedback line 465 to MCU 430 in some embodiments for detecting or monitoring faults of current pulse activity to the EPM key assemblies 410.

The circuits, hardware, and software described in connection with the calibration module 400 of FIG. 4 are meant to be merely an example. Indeed, the present description contemplates the use of any hardware and/or software that receives signals from at least one magnetic field sensor and adjusts the magnetic field of an EPM in order to adjust the actuation force of an EPM key assembly. The number of EPMs, magnetic field sensors and EPM key assemblies may vary per the embodiments described herein.

Figure 5:
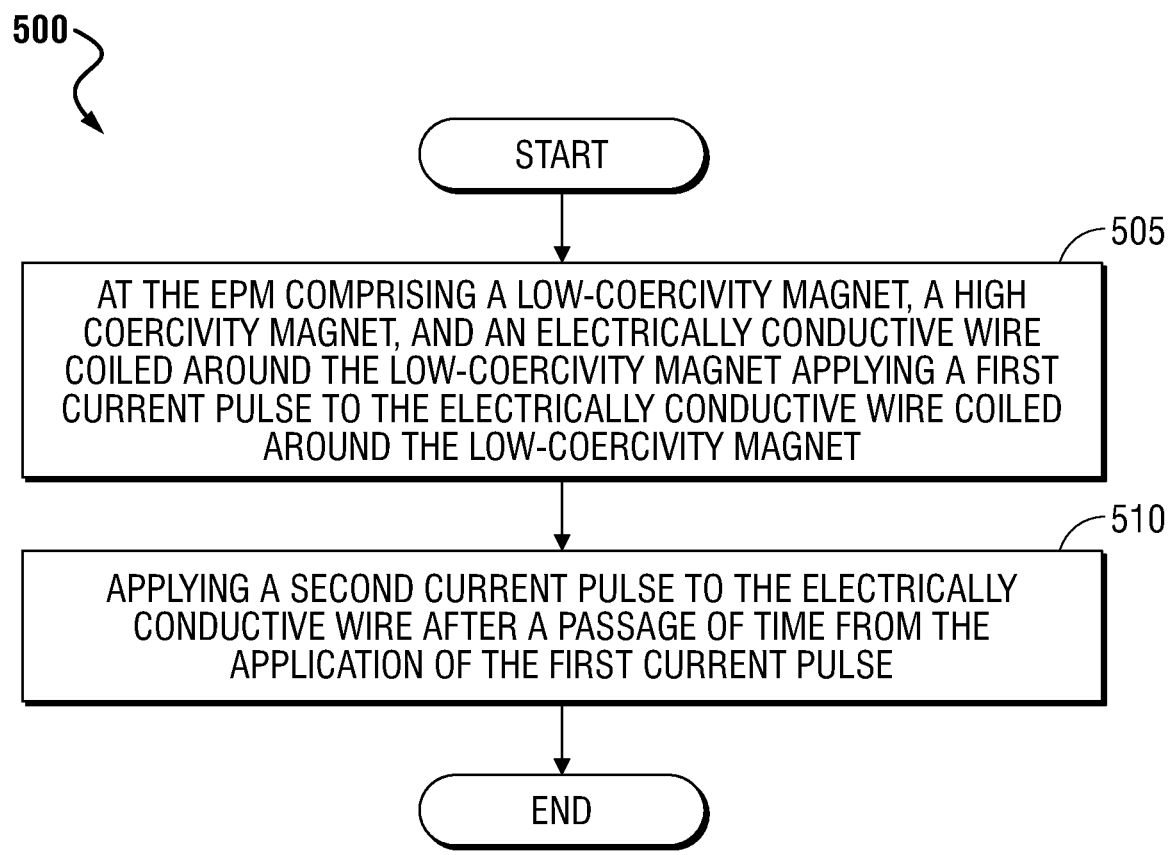
FIG. 5 is a flow diagram illustrating a method of calibrating an EPM magnet of an EPM key assembly of an information handling system according to an embodiment of the present disclosure.

FIG. 5 is a flow diagram illustrating a method 500 of calibrating an electro-permanent magnet (EPM) magnet of an EPM key assembly of an information handling system according to an embodiment of the present disclosure. The method 500 may start with receiving 505, at a processor from an array of magnetic field sensors, a sensed magnitude value of a magnetic field associated with each of the EPM within the array of EPMs. As described herein, the magnetic field sensors may be hall-effect sensors that detect the magnetic fields produced by an EPM or an EPM within an array of EPMs. As described herein, the processor may be an MCU that accesses a look-up table to store and read data descriptive of past calibration data received from the magnetic field sensors.

The method 500 may further include determining 510, with the processor, when any of the plurality of EPMs has a magnitude value varying from an established value. The established value may be any value set by the processor based on either internal data received by the processor or a user-defined value. In the example where the established value is a user-defined value, the processor may receive a desired actuation value used to actuate the EPM key assembly. In this example, the actuation value may be transferred into a magnetic field value used by the processor. In the case where the established value is based on internal data received by the processor, the processor may determine which detected magnetic field value received by the magnetic field sensors is the lowest according to an embodiment. In this example, the lowest detected magnetic field may be set as the established value.

The method 500 may further include adjusting at 515 the magnitude value of the magnetic field associated with the EPMs having a magnitude value that varies from the established value. As described herein, the adjustment may include sending one or a plurality of current pulses to each of the EPMs so as to set their magnetic field to correspond to the established value. In one embodiment, the EPMs may be turned to an "off" state as described herein by applying a reverse voltage to the electrically conductive wire coiled around the low-coercivity magnet. This may be done so as to initially set the EPM to an off state so that it may subsequently be adjusted to an on state reflective of an established value of magnetic field magnitude. In an embodiment, the duration or magnitude of current applied to any given electrically conductive wire coiled around a low-coercivity magnet of any EPM may be adjusted to affect the EPM saturation level thereby placing the magnetic field closer to the established value. In another embodiment, additional or fewer current pulses may be applied to the electrically conductive wire coiled around the low-coercivity magnet so as to tune the magnetic field of the EPM. In an embodiment, the processor may then cause an appropriate current pulse, at an appropriate amperage, to be applied to the EPMs and specifically the electrically conductive wire coiled around the low-coercivity magnet so as to adjust the EPM magnetic field value up or down in accordance with the established value. Again, the adjustment 515 of the magnitude value of the magnetic fields of the EPMs may be accomplished by applying one or a plurality of current pulses to the electrically conductive wire.

In an embodiment, when a lower or lowest magnetic field is detected by any magnetic field detector, that lower or lowest magnetic field is set as the established value. In this embodiment, other EPMs that can reach a relatively higher saturation level (i.e., a higher magnetic field) may be reduced to correlate with the lower or lowest magnetic field detected. This may be accomplished by reducing the current, amperage, or number of current pulses applied to any given electrically conductive wire coiled around the low-coercivity magnet associated with the EPM that can reach that relatively higher saturation level. As such, the magnetic fields of all of the EPMs within an array of EPMs are set to an established value that coincides with that magnetic field produced by an EPM that produces the lowest magnetic field. By setting the established value to coincide with the lowest producible magnetic field among the EPMs, a user may not be able to discern between actuation forces used among the EPM key assemblies.

In an embodiment, the established value may be a range of values and not a specific magnetic field value such that adjustment of the magnetic field produced by any given EPM is within that range. In an example, the range may vary by amperes per meter, deci-, centi-, or milli-amperes per meter based on the ability of the magnetic fields of the EPMs to be adjusted as well as the sensitivity of the magnetic field sensors used to detect that magnetic field producible by the individual EPMs.

The blocks of the flow diagrams of FIG. 5 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. A plurality of electro-permanent magnet (EPM) key assemblies of an information handling system comprising:
the plurality of EPM key assemblies including a plurality of electro-permanent magnets (EPMs) comprising:
a low-coercivity magnet;
a high-coercivity magnet; and
a magnetic field sensor to detect the magnitude of the one or more magnetic field of the EPMs; and
a calibration module to calibrate the magnitude of the one or more magnetic field of the EPMs by:
receiving a sensed magnitude value of the magnetic field associated with the plurality of the EPMs; and
adjusting the magnitude value of the magnetic field associated with each of the EPMs to a value commensurate with each other based on the established value when that magnitude value deviates from an established value by a threshold amount.

2. The EPM key assembly of claim 1, wherein the established value is based on a user-provided actuation value to be associated with each of the EPM key assemblies.

3. The EPM key assembly of claim 1, where the established value is within a range of a magnetic field value associated with a user-defined actuation value, the actuation value defining an actuation force used to actuate the EPM key assembly.

4. The EPM key assembly of claim 1, where the established value is within a rang of a magnetic field value associated with an application-defined actuation value, the actuation value defining an actuation force used to actuate the EPM key assembly.

5. The EPM key assembly of claim 1, wherein adjusting the magnitude value of the magnetic field of one or more of the EPMs comprises:
applying a current pulse at an adjusted current level to an electrically conductive wire coiled around the low-coercivity magnet.

6. The EPM key assembly of claim 1, wherein the information handling system comprises a programmable power supply circuit and a look-up table and wherein the programmable power supply circuit accesses the look up table to determine to what extent to adjust the magnitude of current to adjust the magnetic field associated with each of the EPMs.

7. The EPM key assembly of claim 1, wherein the information handling system comprises a programmable power supply circuit and the programmable power supply circuit receives data descriptive of which among a plurality of EPMs are to have their magnitude of magnetic field adjusted.

8. The EPM key assembly of claim 1, wherein the information handling system comprises a programmable power supply circuit and wherein the programmable power supply circuit sends data descriptive of which among a plurality of EPMs are to have their magnitude of magnetic field adjusted to an H-bridge descriptive of which of the plurality of EPMs are to have their magnitude of magnetic field adjusted.

9. A method of calibrating an array of electro-permanent magnets (EPMs) having a low-coercivity magnet and a high-coercivity magnet associated with a plurality of EPM key assemblies, comprising:
receiving, at a processor from an array of magnetic field sensors, a sensed magnitude value of a magnetic field associated with each EPM within the array of EPMs;
determining, with the processor, when any of the plurality of EPMs has a magnitude value varying from an established value; and
adjusting, via a calibration module the magnitude value of the magnetic field associated with the EPMs having a magnitude value to within a threshold range of the established value such that any EPM key assembly actuation force differences within the array of EPMs is lessened.

10. The method of claim 9, wherein the established value is based on a user-provided actuation value to be associated with each of the EPM key assemblies.

11. The method of claim 9, wherein the established value is based on a detected lowest sensed magnetic field value among the array of EPMs.

12. The method of claim 9, wherein the processor receives location data associated with an EPM among the plurality of EPMs that has a magnitude value varying from the established value.

13. The method of claim 9, wherein adjusting the magnitude value of the magnetic field associated with the EPMs having a magnitude value that varies from the established value comprises applying an adjusted current pulse to those EPMs sufficient to saturate those EPMs toward the established value.

14. The method of claim 9, wherein the adjusting current pulse is determined via accessing a look-up table to compare the established value to the sensed magnitude value of the EPM having a magnitude value that varies from the established value.

15. A plurality of electro-permanent magnet (EPM) key assemblies of an information handling system, each of the plurality of EPM key assemblies comprising:
a pair of scissor plates operably connected to a base contact assembly including an EPM such that each of the pair of scissor plates may rotate away from one another in the presence of downward force on a key cap;
a key cap situated atop the pair of scissor plates for actuation of the EPM key assembly;
the EPM comprising a low-coercivity magnet, and an electrically conductive wire coiled around the low-coercivity magnet, and a high coercivity magnet;
the EPM having an on state to assert a magnetic field on a flange operatively coupled to rotate with at least one scissor plate about a hinge and an off state to release the flange from the magnetic field and retract the key cap;
a magnetic field sensor to sense a magnitude of a magnetic field produced by the EPM in the on state; and
a calibration module to calibrate the magnitude of the magnetic field of the EPM by:
receiving the sensed magnitude of the magnetic field associated with each of the plurality of the EPM key assemblies; and
adjusting the magnitude value of the magnetic field associated with each of the EPM key assemblies to a range of values commensurate with an established value.

16. The EPM key assembly of claim 15, wherein the established value is based on a user-provided actuation value to be associated with each of the EPM key assemblies.

17. The EPM key assembly of claim 15, where the established value is about equal to a magnetic field value associated with a lowest detected actuation value to reduce key actuation value differences among a plurality of EPM key assemblies.

18. The EPM key assembly of claim 15, where the commensurate value is about equal to a value associated with a user-defined actuation value, the actuation value defining an actuation force used to actuate the EPM key assembly.

19. The EPM key assembly of claim 15, wherein adjusting the magnitude value of the magnetic field of the EPM comprises:
applying a current pulse in a first direction to an electrically conductive wire coiled around the low-coercivity magnet to turn the EPM to an off-state; and
applying a currently pulse at an opposite direction to the electrically conductive wire coiled around the low-coercivity magnet at an adjusted current amperage level to adjust the magnetic field value of the EPM in an on state.

20. The EPM key assembly of claim 15, wherein the information handling system comprises a programmable power supply circuit and a look-up table, wherein the programmable power supply circuit accesses the look up table to determine to what extent to adjust the magnitude of the magnetic field associated with each of the EPMs, and wherein the programmable power supply circuit receives data descriptive of which among a plurality of EPMs are to have their magnitude of magnetic field adjusted.

* * * * *